United States Patent [19]
Kurihara et al.

[11] Patent Number: 4,639,925
[45] Date of Patent: Jan. 27, 1987

[54] SEMICONDUCTOR LASER

[75] Inventors: Haruki Kurihara, Tokyo; Minoru Sagara; Kenji Matumoto, both of Yokohama; Hideo Tamura, Kawasaki, all of Japan

[73] Assignee: Kabushiki Kaisha Toshiba, Kawasaki, Japan

[21] Appl. No.: 603,453

[22] Filed: Apr. 24, 1984

[30] Foreign Application Priority Data

Apr. 27, 1983 [JP] Japan .................................. 58-72933
Apr. 27, 1983 [JP] Japan .................................. 58-72934

[51] Int. Cl.$^4$ ............................................... H01S 3/19
[52] U.S. Cl. ...................................... 372/46; 357/17; 372/48; 372/704
[58] Field of Search ....................... 372/44, 45, 46, 48; 357/17

[56] References Cited

U.S. PATENT DOCUMENTS 4,532,631 7/1985 Shima et al. ........................... 372/46

FOREIGN PATENT DOCUMENTS 0040292 4/1981 Japan .
0093593 6/1982 Japan .

OTHER PUBLICATIONS

Ishikawa et al, "Separated Multiclad-Layer Stripe-Geometry GaAlAs DH Laser", *IEEE JQE* vol. QE-17, No. 7, Jul. 1981, pp. 1226-1233.

*Primary Examiner*—James W. Davie
*Attorney, Agent, or Firm*—Cushman, Darby & Cushman

[57] ABSTRACT

A semicondcutor laser comprises a semiconductor base structure provided with an etched channel, and a plurality of semiconductor layers laminated on the base structure by a liquid-phase epitaxial growth method and performing a laser function. The base structure includes a GaAs substrate of one conductivity type, a layer formed on the substrate for preventing deformation of the channel, and an oxidation-preventing layer formed on the channel deformation-preventing layer. A current-blocking layer consisting of GaAs of the opposite conductivity type may be formed between the GaAs substrate and the channel deformation-preventing layer. Further, another layer for preventing the channel deformation may be provided between the GaAs substrate and the current-blocking layer. In the invented semiconductor laser, the semiconductor layers are epitaxially grown sufficiently on the base structure, and the channel deformation can be sufficiently suppressed.

17 Claims, 12 Drawing Figures

SEMICONDUCTOR LASER

BACKGROUND OF THE INVENTION

The present invention relates to a semiconductor laser having a GaAs substrate provided with an etched channel.

Japanese Patent Disclosure No. 52-90280 discloses a channeled substrate planar-stripe (CSP) laser, which is a GaAs-GaAlAs semiconductor laser capable of a transverse mode oscillation. FIG. 1 shows the structure of the CSP laser. The CSP laser comprises an n-type GaAs substrate 1 provided with an etched channel 2, an n-type GaAlAs cladding layer 3, a GaAs active layer 4, a p-type GaAlAs cladding layer 5, an n-type GaAs cap layer 6, a p-type GaAs contact area 7 prepared by selective zinc diffusion, a p-side electrode 8, and an n-side electrode 9. In the region outside the channel 2, the n-type cladding layer 3 is thin enough for the optical field to penetrate the lossy substrate 1 and, therefore, the optical field is confined to the channel region. This optical field confinement provides stable fundamental transverse mode oscillation, if the channel 2 is as narrow as the higher modes are cut-off.

However, the conventional device shown in FIG. 1 gives rise to a serious problem. In the prior art, the heteroepitaxial layers for this device are grown by liquid phase epitaxy (LPE) on a substrate with etched channels, which are, for example, 4 μm wide and 1 μm deep. During the heat-cycle of the LPE, these channels suffer from deformation and are widened. This deformation is caused by the As-atom migration into the ambient gas as well as by the GaAs dissolution into the Ga-Al-As solution. These phenomena are called "mass transfer" and "melt-back", respectively. As a result, the channel width w is increased to 7 μm or more. Therefore, it is very difficult to form narrow channels with high reproducibility by using the prior art.

Japanese Patent Disclosure No. 57-159084 discloses a V-channeled-substrate inner-stripe (VSIS) laser in which an n-type GaAs layer grown on a p-type GaAs substrate acts as a current-blocking-layer (CBL). The basic structure of this prior art is shown in FIG. 3. The VSIS laser comprises a p-type GaAs substrate 13, an n-type GaAs layer 14, which act as a CBL, a channel 21 etched into the CBL 14 to reach the substrate 13, a p-type GaAlAs cladding layer 15, a GaAlAs active layer 16, an n-type GaAlAs cladding layer 17, an n-type GaAs ohmic layer 18, and electrodes 19 and 20. The heteroepitaxial layers 15–18 are grown by LPE successively. The transverse mode stabilization mechanism of the VSIS laser is equal to that of the CSP laser and, therefore, the optical field is restricted in the region of the channel. In the VSIS laser, however, the current is also restricted in the region of the channel because the current is blocked by the CBL outside the channel. Thus, the current width u shown in FIG. 3 as well as the channel width w is an important parameter for determining optical characteristics of the VSIS laser. The heteroepitaxial layers 15–18 are grown by LPE on the substrate with etched channels 21 as shown FIG. 4. However, during the LPE, the channels are deformed by mass transfer and melt-back and, therefore, the width w and u are increased as shown in FIG. 5. The larger w gives the narrower lateral beam divergence. If the width w becomes much larger than the width u, then the optical field is influenced by gain guiding rather than index guiding. As this channel deformation is not uniform within a wafer, the reproducibility of the optical characteristics is very poor even among the devices fabricated from the same wafer.

Japanese Patent Disclosure No. 56-40292 discloses a separated multicladding layer (SML) laser. The SML laser has a CBL like the VSIS laser, but the CBL in the SML laser is not deformed during the LPE. FIG. 6 is a cross sectional view showing the SML laser. In the SML laser, a GaAlAs layer 23 acts as both CBL and cladding layer. As $Ga_{1-x}Al_xAs$ ($0.1 \leq x \leq 1$) does not suffer from mass transfer nor melt-back, the channel 31 is not deformed during the LPE. However, the LPE growth on the side surface of the GaAlAs layer (CBL) 23, which defines a channel 31, is very difficult because of an oxide film on it, which is easily formed by air-exposure. As a result, epitaxial layers 25–28 frequently fail to grow as shown in FIG. 7, which is described in Japanese Patent Disclosure No. 57-93593.

It is seen that the SML laser shown in FIGS. 6 and 7 comprises an n-type GaAs substrate 22, an n-type $Ga_{1-x}Al_xAs$ ($0 < x < 0.1$) optical guide layer 24, an n-type GaAlAs cladding layer 25, a p-type GaAlAs active layer 26, a p-type GaAlAs cladding layer 27, a p-type GaAs cap layer 28, electrodes 29, 30, and the channel 31 in addition to the p-type GaAlAs layer (CBL) 23 mentioned above.

SUMMARY OF THE INVENTION

An object of the present invention is to provide a semiconductor laser comprising a plurality of semiconductor layers laminated on a semiconductor base structure provided with an etched channel. The semiconductor layers are allowed to grow sufficiently when formed by a liquid-phase epitaxial growth method. The deformation of said groove is substantially prevented in the laser manufacturing process.

According to this invention, there is provided a semiconductor laser comprising: a semiconductor base structure provided with an etched channel and including a GaAs substrate of one conductivity type, a layer formed on the GaAs substrate for preventing deformation of the channel, an oxidation preventing layer formed on the channel deformation-preventing layer, and a plurality of semiconductor layers laminated on the semiconductor base structure by a liquid-phase epitaxial growth method; said semiconductor layers performing a laser function.

A current-blocking layer consisting of GaAs of the opposite conductivity type may be formed between the GaAs substrate and the channel deformation-preventing layer. Also, an additional layer for preventing the channel deformation may be formed between the GaAs substrate and the current-blocking layer.

DETAILED DESCRIPTION OF THE PREFERRED EMBODIMENTS

Figure 8:
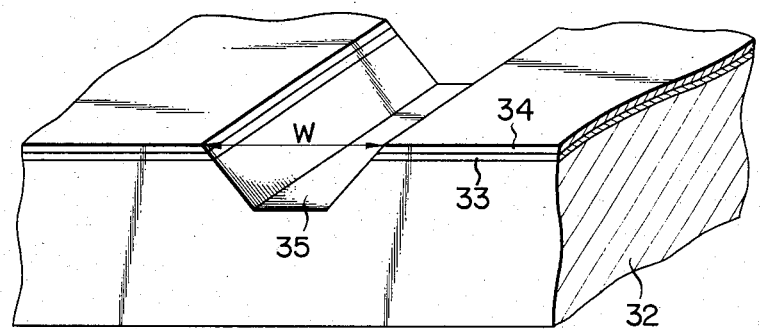
FIG. 8 is an oblique view showing the semiconductor base structure included in a semiconductor laser according to one embodiment of the present invention, said base structure comprising a layer for preventing deformation of a channel formed therein and an oxidation-preventing layer.
Figure 9:
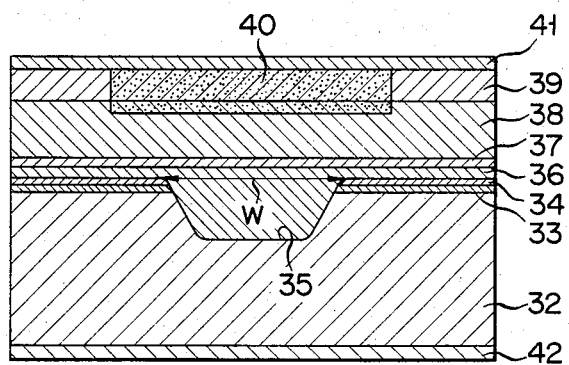
FIG. 9 is a cross sectional view showing a semiconductor laser including the base structure shown in FIG. 8.

FIGS. 8 and 9 collectively show a semiconductor laser according to one embodiment of the present invention. As shown in FIG. 8, a GaAlAs layer 33 having a thickness of 0.1 μm for preventing deformation of a channel and a GaAs layer 34 having a thickness of 0.1 μm for preventing oxidation are formed in succession on an n-type GaAs substrate 32 by thermal decomposition of organic metals and followed by forming a channel 35 having a width w of 4.0±0.2 μm and a depth of 1 μm by the ordinary photalithography and etching process to provide a semiconductor base structure. The layer 33 is formed of $Ga_{0.6}Al_{0.4}As$. A GaAlAs semicondutor having at least 0.1 mole concentration of AlAs is scarcely deformed in the step of liquid-phase epitaxial growth. But the semiconductor mentioned is so easily oxidized that, once exposed to the air, it is impossible to form a good epitaxial layer on the surface thereof. To overcome the difficulty, the oxidation-preventing layer 34 consisting of GaAs is formed on the groove deformation-preventing layer 33 immediately after formation of the layer 33. It should be noted that, if the thickness of the channel deformation-preventing layer 33 exceeds 0.2 μm (2000 Å), the surfaces of the layer 33, exposed in the channel 35 are increased so much that it is impossible to form a satisfactory epitaxial layer on the base structure in the subsequent step. It has been experimentally confirmed that the layer 33 performs a satisfactory function of preventing channel deformation even if the layer 33 is as thin as about 500 Å.

Figure 1:
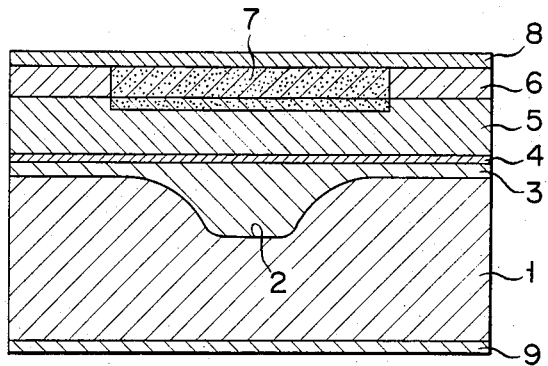
FIG. 1 is a cross sectional view showing a conventional CPS type laser.
Figure 2:
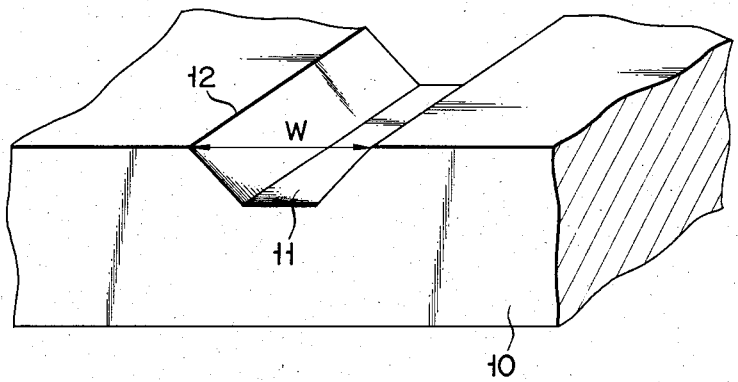
FIG. 2 is an oblique view showing a semiconductor substrate provided with an etched channel, said substrate being included in the CSP laser shown in FIG. 1.

FIG. 9 shows a CSP laser prepared by forming a plurality of semiconductor layers by a liquid-phase epitaxial growth on the semiconductor base structure shown in FIG. 8. As seen from the drawing, the laser shown in FIG. 9 is substantially equal in construction to the laser shown in FIG. 1, and comprises an n-type GaAlPAs cladding layer 36, a GaAs active layer 37, a p-type GaAlAs cladding layer 38, an n-type GaAs cap layer 39, a p-type GaAs contact portion 40 prepared by selective diffusion of zinc, a p-side electrode 41, and an n-side electrode 42. It should be noted that the channel width in FIG. 9 is 4.1±0.2 μm in contrast to 4.0±0.2 μm in FIG. 8. In other words, channel deformation can be suppressed within a measuring error range in the present invention. It should also be noted that the channel in the prior art shown in FIG. 1 is roughly V-shaped. In the present invention, however, the channel is roughly U-shaped, making it possible to form a quite satisfactory optical waveguide mechanism in which a rapid change in effective refractive index is provided within the active layer. What is also important is that the CSP laser which stably performs a single transverse mode oscillation can be produced at a high yield in the present invention.

Figure 3:
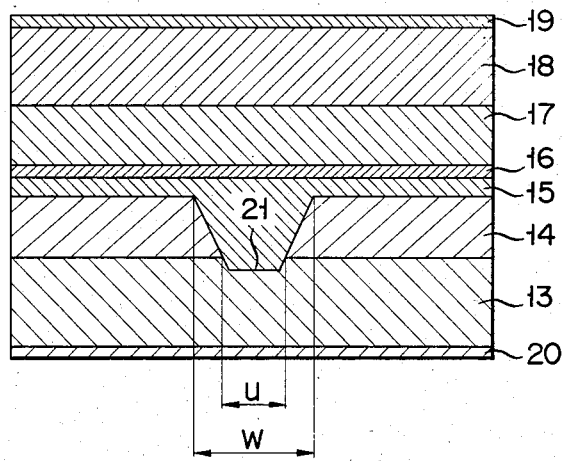
FIG. 3 is a cross sectional view showing a conventional VSIS laser.
Figure 4:
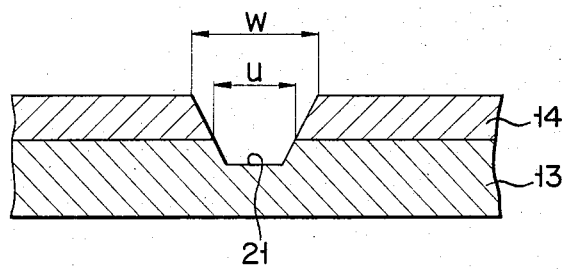
FIGS. 4 and 5 show how the channel included in the device shown in FIG. 3 is deformed.
Figure 5:
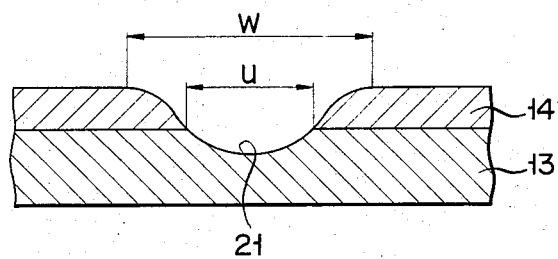
Figure 10:
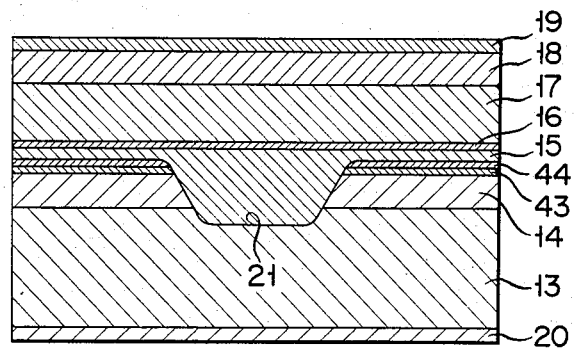
FIG. 10 is a cross sectional view showing a semiconductor laser according to another embodiment of the present invention.

FIG. 10 shows another embodiment of the present invention. In this embodiment, the technical idea of the present invention is applied to the conventional VSIS laser shown in FIG. 3, which comprises the current-blocking layer 14 opposite in its conductivity type to the substrate 13. In FIGS. 3 and 10, the same reference numerals denote the same constituents of the laser. In the embodiment of FIG. 10, the channel expansion is suppressed by a channel deformation-preventing layer 43, making it possible to obtain at a high-yield VSIS type laser which stably performs a single transverse mode oscillation. As seen from the drawing, a GaAs layer 44 for preventing oxidation is also formed in FIG. 10 on the channel deformation-preventing layer 33.

Figure 6:
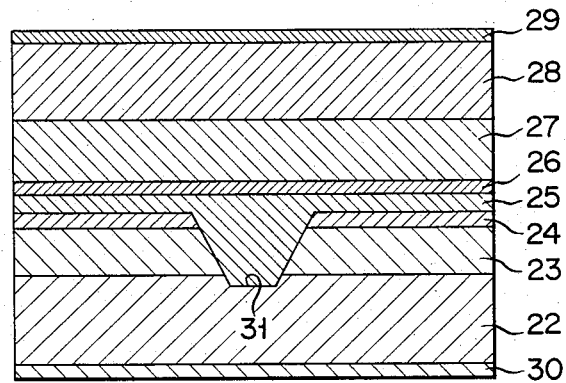
FIG. 6 is a cross sectional view showing a conventional SML laser.
Figure 7:
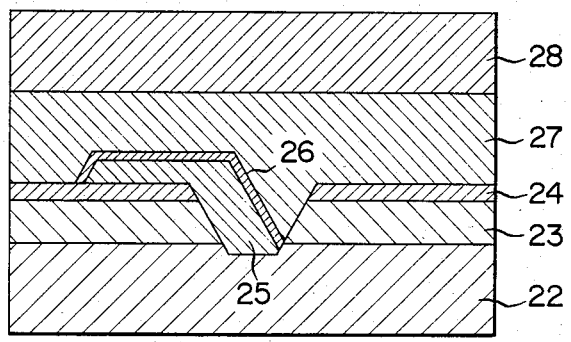
FIG. 7 shows the state of unsatisfactory crystal growth accompanying the SML laser shown in FIG. 6.

In the conventional SML laser shown in FIG. 6 or 7, the GaAlAs layer 23 which serves to prevent the channel deformation also performs the functions of a current-blocking layer and a cladding layer. Thus, the thickness of the layer 23 is made greater than the wavelength of laser light. As previously mentioned, the large thickness, for example, 0.7 μm leads to an unsatisfactory crystal growth in the subsequent step. In the embodiment of the present invention shown in FIG. 10, however, the current-blocking layer 14 consisting of an n-type GaAs and the channel deformation-preventing layer 43 consisting of $Ga_{1-x}Al_xAs$ ($0.1 \leq x \leq 1$) are formed on the p-type GaAs substrate 13. The layer 43 has deformation-preventing facility even if it is thinned to about 500 Å thickness.

Figure 11:
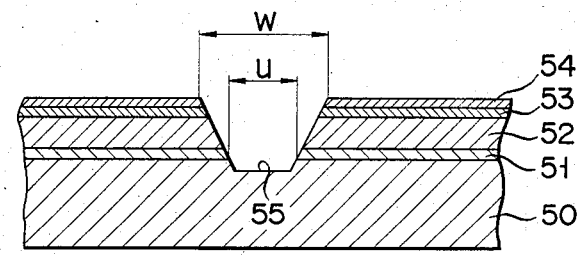
FIG. 11 is a cross sectional view showing the semiconductor base structure included in a semiconductor laser according to still another embodiment of the present invention.
Figure 12:
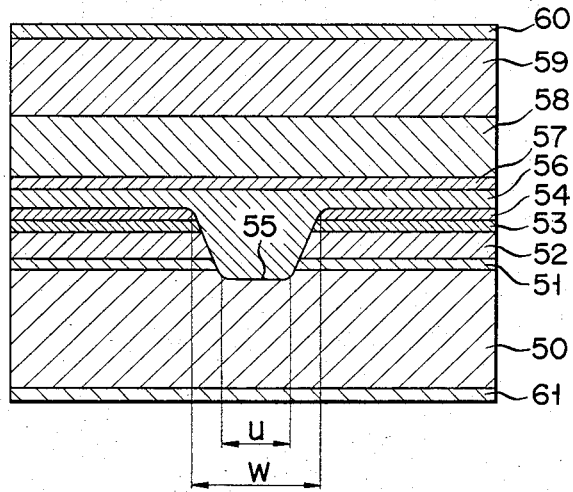
FIG. 12 is a cross sectional view showing a semiconductor laser including the base structure shown in FIG. 11.

FIGS. 11 and 12 collectively show still another embodiment of the present invention. In this embodiment, a current-blocking layer is sandwiched between upper and lower channel deformation-preventing layers. A desired width w at the upper end of the channel is ensured by the upper channel deformation-preventing layer and a desired width u at the bottom of the channel, i.e., the current width is ensured by the lower channel deformation-preventing layer.

Specifically, the base structure shown in FIG. 11 is prepared by successively forming on a p-type GaAs substrate 50 a channel deformation-preventing layer 51, which is a 0.05 μm thick n-type $Al_{0.4}Ga_{0.6}As$ layer; a current-blocking layer 52, which is a 0.6 μm thick n-type GaAs layer; a channel deformation-preventing layer 53, which is a 0.05 μm thick n-type $Al_{0.4}Ga_{0.6}As$ layer; and an oxidation-preventing layer 54, which is a 0.05 μm thick n-type GaAs layer, and followed by forming a channel 55 to reach the substrate 50. These layers 51–54 are formed by thermal decomposition of organic metals.

Semiconductor layers are formed on the base structure shown in FIG. 11 by the liquid-phase epitaxial growth method, and followed by forming electrodes 60 and 61 so as to obtain the laser shown in FIG. 12. The semiconductor epitaxial layers mentioned consist of a p-type $Al_{0.45}Ga_{0.55}As$ first cladding layer 56, a $Ga_{0.9}Al_{0.1}As$ active layer 57, an n-type $Al_{0.45}Ga_{0.55}As$ second cladding layer 58, and an n-type GaAs ohmic layer 59. The liquid-phase epitaxial growth is started at the liquid temperature of 820° C., and the cooling rate is set at 1.2° C./min.

As described previously, the channel width w is restricted by the deformation-preventing layer 53 in the embodiment of FIGS. 11 and 12. Likewise, the current width u is restricted by the deformation-preventing layer 51.

The following table shows the channel width w, the current width u before and after the epitaxial growth step and the beam divergence angle $\theta\,\|$. $\theta\,\|$ is defined as a full beam angle between half-power points in the junction plane.

|  | Before Epitaxial Growth | After Epitaxial Growth | |
|---|---|---|---|
|  |  | FIG. 3* | FIG. 12* |
| w (μm) | 3 | 5–6 | ~3.5 |
| u (μm) | 2 | ~3 | 2 |
| θ (deg) | 13 (design value) | <10 | 12 |

*FIG. 3 (prior art)
FIG. 12 (present invention)

The above table shows that the channel deformation is substantially negligible in the present invention, making it possible to obtain the optical characteristics substantially as designed.

In the embodiment described above, thermal decomposition of organic metals is employed for forming a layer for preventing deformation of the channel. However, a molecular beam epitaxial (MBE) growth method or liquid-phase epitaxial growth method may also be employed in place of the thermal decomposition mentioned above.

As described above in detail, the present invention makes it possible to suppress the channel deformation. It is also possible to form satisfactorily epitaxial semiconductor layers on a semiconductor base structure provided with an etched channel. It follows that it is possible to obtain optical characteristics as designed. In addition, the nonuniformity within a wafer can be markedly suppressed in the present invention.

What is claimed is:

1. A semiconductor laser comprising:
   (i) a semiconductor base structure including a GaAs substrate provided with an etched channel, a channel deformation-preventing layer formed of $Ga_{1-x}Al_xAs$ ($0.1 \leq x \leq 1$) and formed on the surface of said substrate except over said channel, said channel deformation-preventing layer having a thickness of 0.2 μm or less, and an oxidation-preventing layer formed of GaAs and formed on the surface of said channel deformation-preventing layer;
   (ii) a laminated semiconductor structure formed on said base structure and including a lower cladding layer formed on the surface of said semiconductor base structure including said channel, an active layer formed on the surface of said lower cladding layer, and an upper cladding layer formed on the surface of said active layer; and
   (iii) an electrode means for applying current to said active layer.

2. The semiconductor laser according to claim 1, wherein said channel deformation-preventing layer has a thickness of 500 Å to 2000 Å.

3. The semiconductor laser according to claim 1, wherein said lower cladding layer is formed of GaAlAs, said active layer is formed of GaAs, and said upper cladding layer is formed of GaAlAs.

4. The semiconductor laser according to claim 1, wherein said active layer is formed to extend from a region of said channel.

5. The semiconductor laser according to claim 1, wherein said electrode means includes electrodes formed on the bottom surface of said semiconductor base structure and on the top surface of said laminated semiconductor structure, respectively.

6. A semiconductor laser comprising:
   (i) a semiconductor base structure including a GaAs substrate of one conductivity type, provided with an etched channel, a current-blocking layer consisting of GaAs of an opposite conductivity type and formed on the surface of said substrate, except over said channel, a channel deformation-preventing layer formed of $Ga_{1-x}Al_xAs$ ($0.1 \leq x \leq 1$) and formed on the surface of said current-blocking layer, said channel deformation-preventing layer having a thickness of 0.2 μm or less, and an oxidation-preventing layer formed of GaAs and formed on the surface of said channel deformation-preventing layer;
   (ii) a laminated semiconductor structure formed on said base structure and including a lower cladding layer formed on the surface of said semiconductor base structured including said channel, an active layer formed on the surface of said lower cladding layer, and an upper cladding layer formed on the surface of said active layer; and
   (iii) an electrode means for applying current to said active layer.

7. The semiconductor laser according to claim 6, wherein said channel deformation-preventing layer has a thickness of 500 Å to 2000 Å.

8. The semiconductor laser according to claim 6, wherein said current-blocking layer is of n-type and said GaAs substrate is of p-type.

9. The semiconductor laser according to claim 6, wherein said lower cladding layer is formed of GaAlAS, said active layer is formed of GaAs, and said upper cladding layer is formed of GaAlAs.

10. The semiconductor laser according to claim 6, wherein said active layer is formed to extend from a region of said channel.

11. The semiconductor laser according to claim 6, wherein said electrode means includes electrodes formed on the bottom surface of said semiconductor base structure and on the top surface of said laminated semiconductor structure, respectively.

12. A semiconductor laser comprising:
   (i) a semiconductor base structure including a GaAs substrate of one conductivity type provided with an etched channel, a first channel deformation-preventing layer formed of $Ga_{1-x}Al_xAs$ ($0.1 \leq x \leq 1$) and formed on the surface of said substrate except over said channel, said channel deformation-preventing layer having a thickness of 0.2 μm or less, a current-blocking layer consisting of GaAs of an opposite conductivity type and formed on the surface of said first channel deformation-preventing layer, a second channel deformation-preventing layer formed on the surface of said current-blocking layer, and an oxidation-preventing layer formed of GaAs and formed on the surface of said second channel deform'tion-preventing layer;
   (ii) a laminated semiconductor structure formed on said base structure and including a lower cladding layer formed on the surface of asid semiconductor base structure including said channel, an active layer formed on the surface bf said lower cladding layer, and an upper cladding layer formed on the surface of said active layer; and (iii) an electrode means for applying current to said active layer.

13. The semiconductor laser according to claim 12, wherein each of said first and second channel deformation-preventing layers has a thickness of 500 Å to 2000 Å.

14. The semiconductor laser according to claim 12, wherein said current-blocking layer is of n-type and said GaAs substrate is of p-type.

15. The semiconductor laser according to claim 12, wherein said lower cladding layer is formed of GaAlAs, said active layer is formed of GaAs, and said upper cladding layer is formed of GaAlAs.

16. The semiconductor laser according to claim 12, wherein said active layer is formed to extend from a region of said channel.

17. The semiconductor laser according to claim 12, wherein said electrode means includes electrodes formed on the bottom surface of said semiconductor base structure and on the top surface of said laminated semiconductor structure, respectively.

* * * * *